US008919933B2

(12) United States Patent
Wang

(10) Patent No.: US 8,919,933 B2
(45) Date of Patent: Dec. 30, 2014

(54) LIQUID EJECTING HEAD AND LIQUID EJECTING APPARATUS USING THE SAME

(75) Inventor: Xiaoxing Wang, Chino (JP)

(73) Assignee: Seiko Epson Corporation, Tokyo (JP)

( * ) Notice: Subject to any disclaimer, the term of this patent is extended or adjusted under 35 U.S.C. 154(b) by 567 days.

(21) Appl. No.: 12/868,893

(22) Filed: Aug. 26, 2010

(65) Prior Publication Data

US 2011/0050811 A1    Mar. 3, 2011

(30) Foreign Application Priority Data

Aug. 27, 2009  (JP) ................. 2009-197409

(51) Int. Cl.
| | |
|---|---|
| B41J 2/045 | (2006.01) |
| B41J 2/16 | (2006.01) |
| H01L 41/08 | (2006.01) |
| H01L 41/319 | (2013.01) |
| H01L 41/09 | (2006.01) |
| H01L 41/187 | (2006.01) |
| H01L 41/318 | (2013.01) |
| B41J 2/055 | (2006.01) |
| B41J 2/14 | (2006.01) |

(52) U.S. Cl.
CPC .............. *B41J 2/14233* (2013.01); *B41J 2/161* (2013.01); *B41J 2002/14419* (2013.01); *H01L 41/0815* (2013.01); *H01L 41/319* (2013.01); *B41J 2/1628* (2013.01); *B41J 2/1646* (2013.01); *H01L 41/0973* (2013.01); *B41J 2/1629* (2013.01); *B41J 2/1623* (2013.01); *B41J 2002/14241* (2013.01); *H01L 41/1878* (2013.01); *H01L 41/318* (2013.01); *B41J 2/1632* (2013.01); *B41J 2/055* (2013.01)
USPC ............... 347/71; 347/68; 310/357; 310/365; 29/25.35

(58) Field of Classification Search
USPC .............. 347/68, 71; 310/357, 358, 360, 365; 29/25.35
See application file for complete search history.

(56) References Cited

U.S. PATENT DOCUMENTS

| | | | |
|---|---|---|---|
| 7,216,962 B2 | 5/2007 | Miyazawa et al. | |
| 7,343,654 B2 * | 3/2008 | Xin-Shan | 29/25.35 |
| 7,652,408 B2 * | 1/2010 | Fujii | 310/311 |
| 7,759,846 B2 | 7/2010 | Sakashita et al. | |
| 7,872,402 B2 | 1/2011 | Kobayashi et al. | |
| 7,872,403 B2 * | 1/2011 | Wang | 310/358 |
| 2006/0288928 A1 * | 12/2006 | Eom et al. | 117/89 |
| 2008/0123243 A1 * | 5/2008 | Hamada et al. | 361/301.1 |
| 2010/0103226 A1 * | 4/2010 | sakashita et al. | 347/68 |

FOREIGN PATENT DOCUMENTS

| | | | |
|---|---|---|---|
| JP | 2001-223404 | 8/2001 | |
| JP | 2005-39166 | 2/2005 | |
| JP | 2005302933 A * | 10/2005 | H01L 41/09 |
| JP | 2006-86368 | 3/2006 | |

(Continued)

OTHER PUBLICATIONS

H. W. Jang, et al "Epitaxial (001) BiFeO3 membranes with substantially reduced fatigue and leakage" Applied Physics Letters, 92, 0629010 (2008).

*Primary Examiner* — Daniel Petkovsek
(74) *Attorney, Agent, or Firm* — Workman Nydegger

(57) ABSTRACT

A liquid ejecting head includes a piezoelectric element including a first electrode, a seed layer provided on the first electrode and containing $BiFeO_3$ with (001) plane preferential orientation, a piezoelectric layer provided on the seed layer and containing a perovskite-structure (Bi, Nd)(Fe, Mn, Al)$O_3$ composition with (001) plane preferential orientation, and a second electrode provided on the piezoelectric layer.

7 Claims, 8 Drawing Sheets

(56) References Cited

FOREIGN PATENT DOCUMENTS

| JP | 2006-176966 | 7/2006 |
| JP | 2008-311634 | 12/2008 |
| JP | 2009-70926 | 4/2009 |
| JP | 2009-84126 | 4/2009 |

* cited by examiner

LIQUID EJECTING HEAD AND LIQUID EJECTING APPARATUS USING THE SAME

CROSS-REFERENCE TO RELATED APPLICATIONS

This application claims the benefit of priority to Japanese Patent Application No. 2009-197409 filed Aug. 27, 2009, the contents of which are hereby incorporated by reference in their entirety.

BACKGROUND

1. Technical Field

The present invention relates to a liquid ejecting head and a liquid ejecting apparatus using the same.

2. Related Art

A typical example of liquid ejecting heads is an ink jet recording head including a vibrating plate which constitutes a portion of a pressure-generating chamber communicated with a nozzle orifice which ejects ink droplets so that the vibrating plate is deformed by a piezoelectric element to apply pressure to ink in the pressure-generating chamber, ejecting the ink as ink droplets from the nozzle orifice. An example of the piezoelectric element used in the ink jet recording head includes a piezoelectric layer composed of a piezoelectric material exhibiting an electro-mechanical conversion function, for example, a crystallized dielectric material, the piezoelectric layer being interposed between two electrodes. Such a piezoelectric element is mounted as a flexural oscillation-mode actuator device on a liquid ejecting head. The piezoelectric element mounted on the ink jet recording head is formed by, for example, forming a uniform piezoelectric material layer over the whole surface of the vibrating plate by a film forming technique and cutting the piezoelectric material layer into a shape corresponding to a pressure-generating chamber by lithography so that the piezoelectric material layer is independent for each pressure-generating chamber.

The piezoelectric material used for such a piezoelectric element is required to have high displacement characteristics and a high Curie temperature. A typical example of piezoelectric materials satisfying these conditions is lead zirconate titanate (PZT) (refer to, for example, Japanese Unexamined Patent Application Publication No. 2001-223404).

However, a piezoelectric material not containing lead which is a harmful substance is required from the viewpoint of environmental pollution. An example of the piezoelectric material not containing lead is $BiFeO_3$ having a perovskite structure represented by $ABO_3$. $BiFeO_3$ is a material having excellent piezoelectric characteristics and has the advantage of a high Curie temperature due to covalent bonds formed between bismuth and oxygen and between iron and oxygen On the other hand, a piezoelectric element using $BiFeO_3$ as a piezoelectric material has a leakage current and has the problem that dielectric breakdown may occur even at a driving voltage of, for example, about 25 V. In addition, a piezoelectric element using $BiFeO_3$ as a piezoelectric material has a high offset voltage (critical voltage), i.e., a high lower limit of operating voltage, and thus has the problem of the need to apply a high bias voltage. These problems are not limited to liquid ejecting heads such as the ink jet recording head, but are also present in liquid ejecting heads mounted on other apparatuses.

SUMMARY

An advantage of some aspects of the invention is that the invention provides a liquid ejecting head including a piezoelectric element not containing lead and capable of suppressing current leakage and decreasing the offset voltage and also provides a liquid ejecting apparatus using the head.

A liquid ejecting head according to an embodiment of the present invention includes a piezoelectric element including a first electrode, a seed layer provided on the first electrode and containing $BiFeO_3$ with (001) plane preferential orientation, a piezoelectric layer provided on the seed layer and containing a perovskite-structure (Bi, Nd) (Fe, Mn, Al)$O_3$ composition with (001) plane preferential orientation, and a second electrode provided on the piezoelectric layer. In the present invention, the piezoelectric layer does not contain lead and contains a (Bi, Nd) (Fe, Mn, Al)$O_3$ composition, and further the piezoelectric layer is preferentially oriented along the (001) plane. Therefore, leakage can be suppressed, and the offset voltage can be decreased.

The first electrode is preferably composed of $SrRuO_3$. Since the first electrode is composed of $SrRuO_3$, the seed layer is easily preferentially oriented along the (001) plane.

A passage-forming substrate including the piezoelectric element provided on a surface thereof and a pressure-generating chamber communicated with a nozzle orifice is a preferably a silicon substrate having a surface with (001) plane preferential orientation, the pressure-generating chamber being formed on the surface. Since the passage-forming substrate is the silicon substrate with (001) plane preferential orientation, each of the films formed on the passage-forming substrate is easily preferentially oriented along the (001) plane.

In addition, an elastic film composed of $SrTiO_3$ is preferably formed between the first electrode and the passage-forming substrate including the silicon substrate with (001) plane preferential orientation. The piezoelectric film is easily preferentially oriented along the (001) plane by using, as the elastic film, $SrTiO_3$ with (001) plane preferential orientation.

A liquid ejecting apparatus according to an embodiment of the present invention includes the above-described liquid ejecting head. Since the liquid ejecting head is provided, leakage of the piezoelectric element can be suppressed, and the offset voltage can be decreased, thereby permitting drive at a low voltage with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Liquid Ejecting Head

Figure 1:
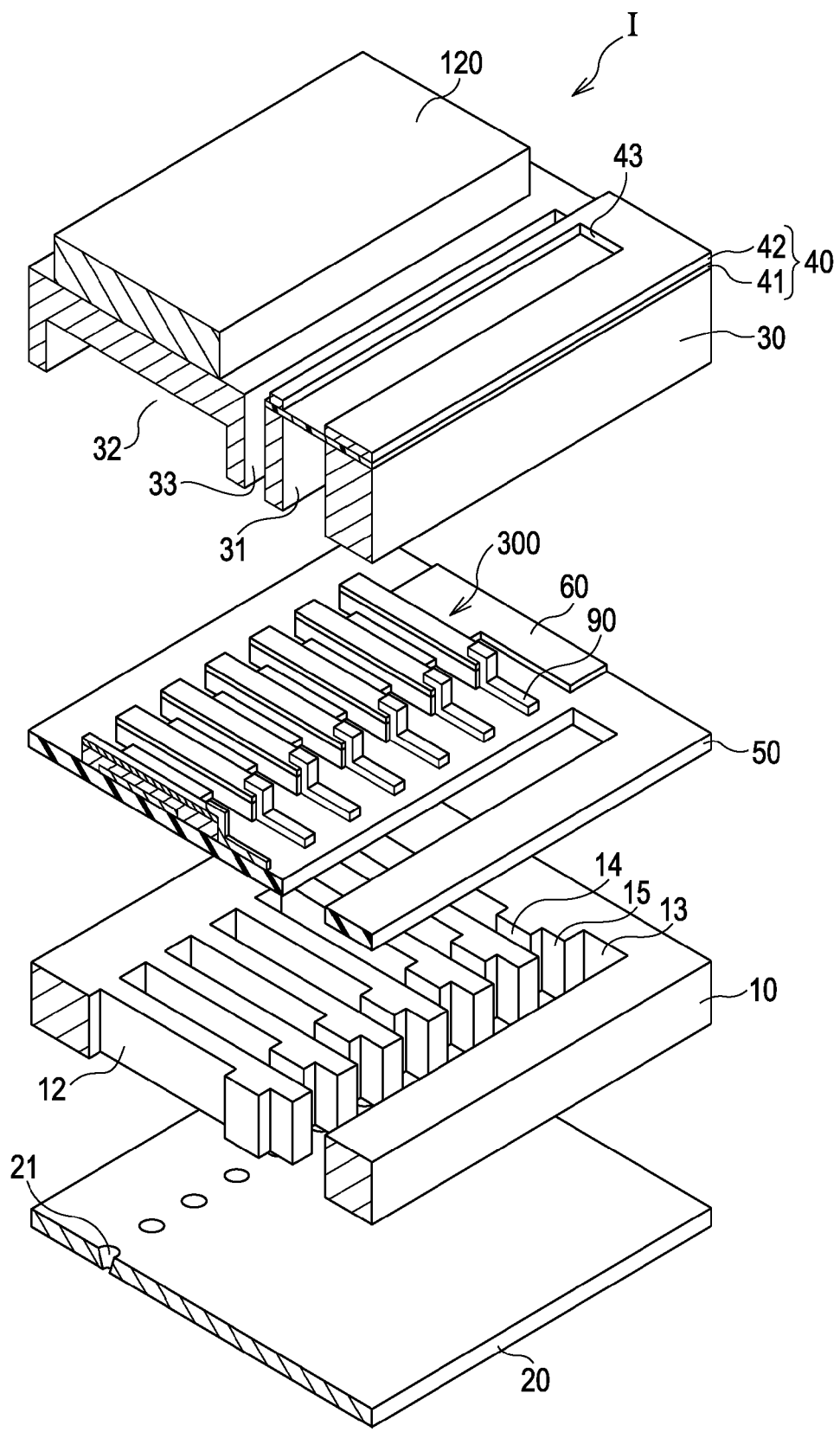
FIG. 1 is an exploded perspective view of a recording head according to an embodiment of the present invention.
Figure 2A:
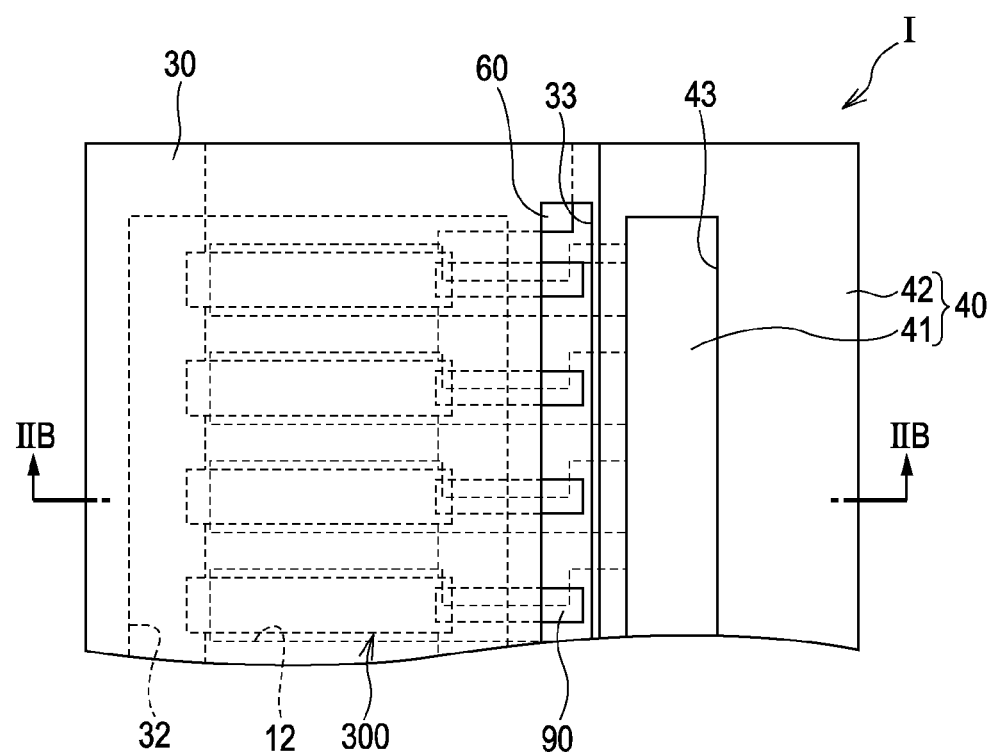
FIG. 2A is a plan view of a recording head according to an embodiment of the present invention.

FIG. 1 is an exploded perspective view showing a schematic configuration of an ink jet recording head as an example of a liquid ejecting head according to a first embodiment of the present invention. FIG. 2A is a plan view of FIG. 1 and FIG. 2B is a sectional view taken along line IIB-IIB in FIG. 2A.

Figure 2B:
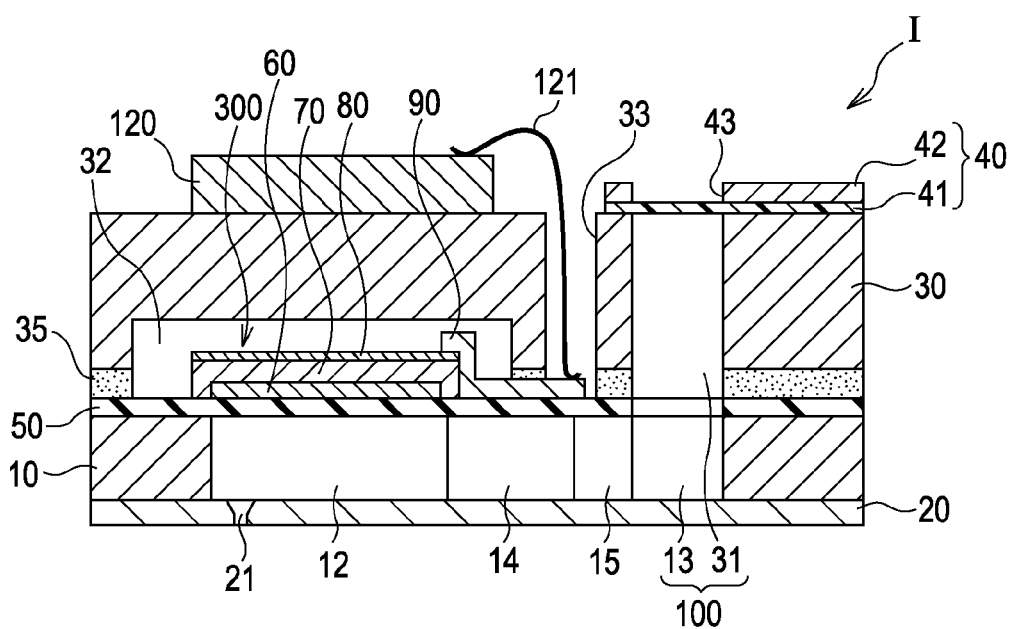
FIG. 2B is a sectional view of a recording head according to an embodiment of the present invention.

As shown in FIGS. 1, 2A, and 2B, a passage-forming substrate 10 according to this embodiment includes a silicon single-crystal substrate having a surface with (001) plane preferential orientation, and an elastic film 50 is formed on the surface. In the present invention, the expression "(001) plane preferential orientation" includes a case in which all crystals are oriented along a (001) plane and a case in which most crystals (e.g., 90% or more) are oriented along a (001) plane.

The passage-forming substrate 10 includes a plurality of pressure-generating chambers 12 disposed in parallel in the width direction. The passage-forming substrate 10 also includes a communication portion 13 formed in a region outside the pressure-generating chambers 12 in the longitudinal direction so that the communication portion 13 is communicated with the pressure-generating chambers 12 through ink supply passages 14 and communication passages 15 provided for the respective pressure-generating chambers 12. The communication portion 13 is communicated with a reservoir portion 31 of a protective substrate described below to form a portion of a reservoir 100 serving an ink chamber common to the pressure-generating chambers 12. The ink supply passages 14 are formed to have a narrower width than the pressure-generating chambers 12 so that the flow resistance of the ink flowing in the pressure-generating chambers 12 from the communication portion 13 is kept constant. Although, in this embodiment, each of the ink supply passages 14 is formed by narrowing the width of the flow passage from one of the sides, the ink supply passages 14 may be formed by narrowing the width of the flow passage from both sides. The ink supply passages 14 may formed by narrowing in the thickness direction instead of narrowing the width of the flow passage.

In addition, a nozzle plate 20 is fixed to the orifice-side surface of the passage-forming substrate 10 with an adhesive film, a heat-seal film, or the like, the nozzle plate 20 having nozzle orifices 21 formed therein and communicated with the vicinities of the ends of the respective pressure-generating chambers 12 on the side opposite to the ink supply passage 14 side. The nozzle plate 20 is composed of, for example, glass ceramics, a silicon single-crystal substrate, stainless steel, or the like.

On the other hand, the above-described elastic film 50 is formed on a surface of the passage-forming substrate 10 on the side opposite to the orifice side. A film which can be used as the elastic film 50 is a $SrTiO_3$ or $SrSnO_3$ film or the like having a thickness of 5 to 50 nm, which has such a degree of elasticity that the film can function as a vibrating plate of a piezoelectric element and which is considered to have substantially the same lattice constant as a piezoelectric film 70 described below (lattice constant of the piezoelectric film 70: 3.94 to 3.99, lattice constant of the elastic film 50: 3.905 to 3.959). The elastic film 50 formed on the silicon single-crystal substrate with (001) plane preferential orientation has a (001) plane preferential orientation. Namely, the elastic film 50 is affected by an underlying layer because it is formed by epitaxial growth using a sol-gel method. In this case, the elastic film 50 is not affected by the underlying layer and cannot be subjected to crystal growth unless the lattice constant is the same or substantially the same as the underlying layer. The elastic film 50 used in this embodiment has the same or substantially the same lattice constant as the underlying layer and thus has (001) plane preferential orientation due to the influence by the passage-forming substrate 10 as the underlying layer, which includes the silicon single-crystal substrate with (001) plane preferential orientation. In the embodiment, $SrTiO_3$ (lattice constant: 3.905) is used for the elastic film 50.

In addition, a first electrode 60, the piezoelectric layer 70 including a thin film having a thickness of 10 µm or less, preferably 0.2 to 1.5 µm, and a second electrode 80 are laminated on the elastic film 50 to form a piezoelectric element 300. The piezoelectric element 300 corresponds to a portion including the first electrode 60, the piezoelectric layer 70, and the second electrode 80. In general, one of the electrodes of the piezoelectric element 300 serves as a common electrode, and the other electrode and the piezoelectric layer 70 are formed by patterning for each of the pressure-generating chambers 12. In this embodiment, the first electrode 60 corresponds to the common electrode of the piezoelectric elements 300, and the second electrode 80 corresponds to the individual electrode. However, these electrodes may be reserved in view of a driving circuit and wiring. Here, the combination of the piezoelectric element 300 and the vibrating plate producing displacement due to driving of the piezoelectric element 300 is referred to as an "actuator device".

As the first electrode 60, a perovskite structure-oxide electrode material, such as $SrRuP_3$, LNO (lanthanum nickel oxide), $(La, Sr)CO_3$, or the like, which can function as an electrode and which is considered to have substantially the same lattice constant as the piezoelectric layer 70 and the elastic film 50 (lattice constant of the elastic film 50: 3.905 to 3.939, lattice constant of the first electrode 60: 3.90 to 3.95) can be used. The first electrode 60 also has substantially the same lattice constant as a material used for the elastic film 50, i.e., substantially the same lattice constant as the silicon substrate with (001) plane preferential orientation. As described below, the first electrode 60 is formed by epitaxial growth using a sol-gel method on the elastic film 50 with (001) plane preferential orientation, and thus the first electrode 60 also has (001) plane preferential orientation. In this embodiment, $SrRuO_3$ (lattice constant: 3.94) is used for the first electrode 60. In this case, the cost can be suppressed using $SrRuO_3$ as compared with a case using, for example, platinum or the like for the first electrode.

In addition, a seed layer 75 which is described in detail below is formed between the first electrode 60 and the piezoelectric layer 70. The seed layer 75 is composed of $BiFeO_3$. The seed layer 75 is provided for controlling orientation of the piezoelectric layer 70 and suppressing cracking of the piezoelectric layer 70 and has a thickness of, for example, 20 to 200 nm. As described below, the seed layer 75 is also formed by epitaxial growth and has (001) plane preferential orientation due to the influence of the first electrode 60 as an underlying layer.

The piezoelectric layer 70 formed on the first electrode 60 contains a $(Bi, Nd)(Fe, Mn, Al)O_3$ composition. Specifically, the piezoelectric layer 70 contains $BiFeO_3$ as a main component (e.g., 80% of the whole of the piezoelectric layer 70) and further contains $NdMnO_3$ and $BiAlO_3$ (e.g., 15% and 5%, respectively, of the whole of the piezoelectric layer 70), and has (001) plane preferential orientation by epitaxial growth. In this way, in the embodiment, the piezoelectric layer 70 contains $BiFeO_3$, $NdMnO_3$, and $BiAlO_3$ and has (001) plane preferential orientation, and thus it is possible to suppress leakage and decrease the offset voltage value. As a result, the ink jet recording head becomes endurable to practical use. Details are described below.

In general, when $BiFeO_3$ is used as a lead-free piezoelectric material, dielectric breakdown may occur at a driving voltage of, for example, about 25 V due to a large leakage current, and a high bias voltage is required because of a high offset voltage. Therefore, it is necessary to suppress these problems.

In this embodiment, therefore, $NdMnO_3$ is added as an additive to $BiFeO_3$ in order to suppress a leakage current. This is because electric destabilization of $BiFeO_3$ due to Fe can be suppressed by adding $NdMnO_3$ containing Mn. In addition, not only electric stabilization is caused by adding $NdMnO_3$ to $BiFeO_3$, but also a crystal structure can be changed by adding $NdMnO_3$ containing Nd to $BiFeO_3$ to form crystal phase boundaries. This facilitates rotation of domains and consequently can decrease the offset voltage and improve a displacement. Therefore, the addition of $NdMnO_3$ can significantly suppress the leakage current, and decrease the offset voltage and improve a displacement. However, the addition of $NdMnO_3$ alone may make it impossible to endure practical use. Therefore, in this embodiment, $BiAlO_3$ as well as $NdMnO_3$ is added to $BiFeO_3$ in order to further suppress the leakage current.

In addition, the offset voltage can be further decreased by adding $BiAlO_3$ to $BiFeO_3$. This is because when tetragonal $BiAlO_3$ is added to rhombohedral $BiFeO_3$, tetragonal and rhombohedral crystals coexist to form crystal phase boundaries. This facilitates rotation of domains and consequently can decrease the offset voltage and improve a displacement.

As described above, by adding the two additives, the leakage current can be sufficiently suppressed, and the offset voltage can be decreased. However, the offset voltage is required to be further decreased. Therefore, in this embodiment, further, the crystal plane of the piezoelectric layer 70 is preferentially oriented along the (001) plane. The offset voltage can be decreased by (001) plane preferential orientation. In order to produce (001) plane preferential orientation, the seed layer 75 with (001) plane preferential orientation is provided as the underlying layer for the piezoelectric layer 70 containing $BiFeO_3$ as a main component and further containing $NdMnO_3$ and $BiAlO_3$.

In order to provide the seed layer 75 with (001) plane preferential orientation, it is preferred that each of the underlying layers has (001) plane preferential orientation. Therefore, in this embodiment, as described above, the passage-forming substrate 10, the elastic film 50, and the first electrode 60 are selected to have their functions and substantially the same lattice constants as the piezoelectric layer 70 so that they can be preferentially oriented along the (001) plane.

In addition, the leakage cannot be sufficiently suppressed and the offset voltage cannot be sufficiently decreased by simply using the piezoelectric layer 70 composed of only $BiFeO_3$ and preferentially orienting it along the (001) plane. Therefore, in order to sufficiently suppress the leakage and sufficiently decrease the offset voltage, $NdMnO_3$ and $BiAlO_3$ are further added, and a predetermined underlying layer is selected for preferentially orienting the piezoelectric layer 70 containing these components along the (001) crystal plane.

When the seed layer 75 is not provided, it may be difficult to preferentially orient the crystal plane of the piezoelectric layer 70 along the (001) plane even by using the above-described materials for the piezoelectric layer 70. Therefore, in this embodiment, the seed layer 75 is provided.

Namely, in this embodiment, the piezoelectric layer 70 containing $BiFeO_3$ as a main component and further containing $NdMnO_3$ and $BiAlO_3$ is preferentially oriented along the (001) plane by providing the seed layer 75 with (001) plane preferential orientation. As a result, the offset voltage is sufficiently decreased, and the leakage is sufficiently suppressed, thereby providing the ink jet recording head 1 having high reliability and the liquid ejection characteristics of a low driving voltage and durability to practical use. In addition, since the piezoelectric layer 70 is preferentially oriented along the (001) plane, durability can be improved, thereby making the ink jet recording head 1 more desirable.

Further, a lead electrode 90 composed of, for example, gold (Au) or the like is connected to the second electrode 80 serving as the individual electrode of the piezoelectric element 300 so as to be led from the vicinity of the ink supply passage-side end and extended to the elastic film 50.

Further, a protective substrate 30 including a reservoir portion 31 which constitutes at least a portion of the reservoir 100 is bonded, with an adhesive 35, to the passage-forming substrate 10 on which the piezoelectric elements 300 are formed, i.e., the first electrodes 60, the elastic film 50, and the lead electrodes 90 are formed. In this embodiment, the reservoir portion 31 is formed over the pressure-generating chambers 12 in the width direction so as to pass through the protective substrate 30 in the thickness direction. Also, the reservoir portion 31 is communicated with the communication portion 13 of the passage-forming substrate 10 to form the reservoir 100 serving as an ink chamber common to the pressure-generating chambers 12. The communication portion 13 of the passage-forming substrate 10 may be divided into a plurality of portions for the respective pressure-generating chambers 12 so that only the reservoir portion 31 serves as the reservoir 100. Further, the passage-forming substrate 10 may be provided with only the pressure-generating chambers 12 so that the ink supply passages 14 which communicate the reservoir 100 with the pressure-generating chambers 12 are provided in a member (e.g., the elastic film 50) interposed between the passage-forming substrate 10 and the protective substrate 30.

In addition, a piezoelectric element holding portion 32 is provided in a region of the protective substrate 30, which faces the piezoelectric elements 300, so as to have a space enough to avoid inhibition to the movement of the piezoelectric elements 300. The space of the piezoelectric element holding portion 32 may be sealed or not as long as the space is enough to avoid inhibition to the movement of the piezoelectric elements 300.

For the protective substrate 30, a material having substantially the same thermal expansion coefficient as the passage-forming substrate 10, for example, glass, a ceramic material, or the like, is preferably used. In this embodiment, a silicon single-crystal substrate composed of the same material as the passage-forming substrate 10 is used.

In addition, a through hole 33 is provided in the protective substrate 30 to pass through the protective substrate 30 in the thickness direction. The lead electrode 90 led from each of the piezoelectric elements 300 is provided so that the vicinity of the end is exposed in the through hole 33.

Further, a driving circuit 120 is fixed to the protective substrate 30 in order to drive the piezoelectric elements 300 disposed in parallel. As the driving circuit 120, for example, a circuit board, a semiconductor integrated circuit (IC), or the like can be used. The driving circuit 120 is electrically connected to the lead electrodes 90 through connecting wires 121 composed of conductive wires such as bonding wires or the like.

In addition, a compliance substrate 40 including a sealing film 41 and a fixing plate 42 is bonded to the protective substrate 30. The sealing film 41 is composed of a material having low rigidity and flexibility, and one of the sides of the reservoir portion 31 is sealed with the sealing film 41. The fixing plate 42 is made of a relatively hard material. The fixing plate 42 has an opening 43 formed by completely removing a region facing the reservoir 100 in the thickness direction. Therefore, one of the sides of the reservoir 100 is sealed with only the sealing film 41 with flexibility.

In the ink jet recording head according to this embodiment, an ink is introduced through an ink inlet connected to an outside ink supply unit (not shown) so that the inside ranging from the reservoir 100 to the nozzle orifices 21 is filled with the ink. Then, the elastic film 50, the first electrode 60, and the piezoelectric layer 70 are flexurally deformed by applying a voltage between the first electrode 60 and the second electrode 80 corresponding to each of the pressure-generating chambers 12 according to a recording signal input from the driving circuit 120. As a result, the pressure in each of the pressure-generating chambers 12 is increased to eject ink droplets from the nozzle orifices 21.

(Method for Manufacturing Liquid Ejecting Head)

The method for manufacturing the ink jet recording head according to this embodiment is described with reference to FIGS. 3A to 5C. FIGS. 3A to 5C are sectional views showing the method for manufacturing the ink jet recording head according to this embodiment.

Figure 3A:
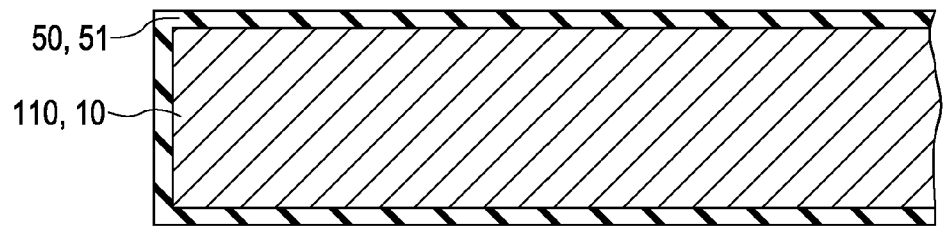
FIGS. 3A to 3C are schematic sectional views of a principal portion, showing steps for manufacturing of a recording head according to an embodiment of the present invention.

First, as shown in FIG. 3A, an oxide film 51 composed of $SrTiO_3$ which constitutes the elastic film 50 is formed on a surface of a passage-forming substrate wafer 110 which is a silicon wafer with (001) plane preferential orientation and on which a plurality of passage-forming substrates 10 are integrally formed. The method for forming the oxide film 51 is not particularly limited, but the oxide film 51 can be formed by a dipping method or a sol-gel method including applying a sol of an organo-metallic compound dissolved/dispersed in a solvent, gelling the sol by drying, and then burning the gel at a high temperature to form a metal oxide. In this embodiment, the oxide film 51 is formed by the sol-gel method, and thus the oxide film 51 (elastic film 50) composed of $SrTiO_3$ with (001) plane preferential orientation can be formed.

Figure 3B:
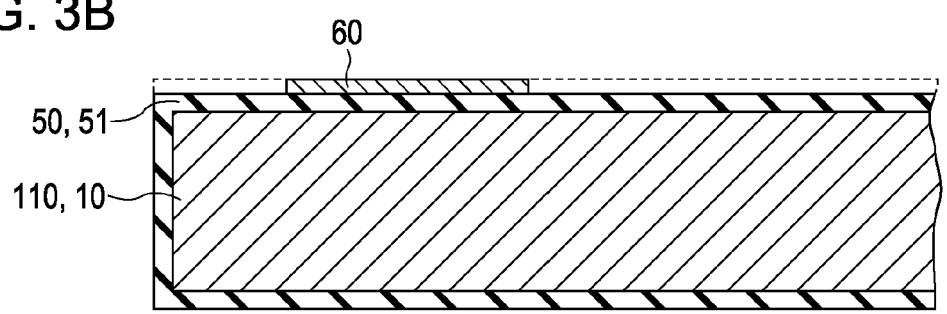

Then, as shown in FIG. 3B, the first electrode 60 composed of $SrRuO_3$ is formed on the oxide film 51. The method for forming the first electrode 60 is not particularly limited, but the first electrode 60 can be formed by a sol-gel method or a dipping method. In this embodiment, the first electrode 60 is formed by the sol-gel method, and thus the first electrode 60 composed of $SrRuO_3$ with (001) plane preferential orientation can be formed on the basis of the (001) plane of the oxide film 51 as an underlying layer. Then, the first electrode 60 is patterned to a predetermined shape by, for example, dry etching such as ion milling or the like.

Figure 3C:
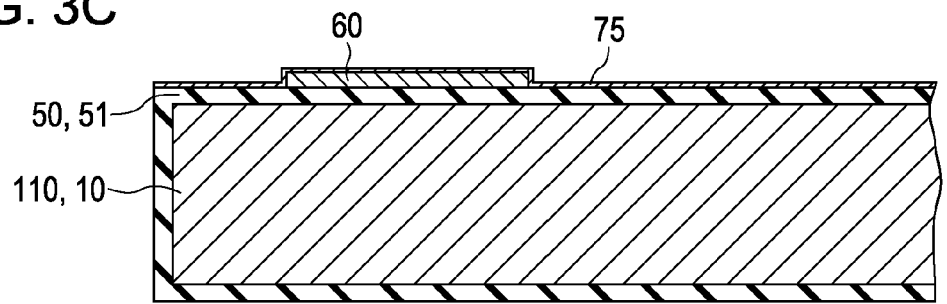

Then, as shown in FIG. 3C, the seed layer 75 is formed on the first electrode 60. In this embodiment, the seed layer 75 is formed by a sputtering method. Therefore, the seed layer 75 composed of $BiFeO_3$ with (001) plane preferential orientation can be formed on the basis of the (001) plane of the first electrode 60 as an underlying layer. In addition, stress can be decreased by forming on the basis of the sputtering method, thereby suppressing the occurrence of cracking. The method for forming the seed layer 75 is not limited to the sputtering method, and for example, a MOD (Metal-Organic Decomposition) method, a sol-gel method, or the like may be used.

Next, the piezoelectric layer 70 containing $BiFeO_3$ as a main component and further containing $NdMnO_3$ and $BiAlO_3$ is formed on the seed layer 75. In this embodiment, the piezoelectric layer 70 is formed by a sol-gel method. The method for forming the piezoelectric layer 70 is not limited to the sol-gel method, and for example, a MOD (Metal-Organic Decomposition) method, a sputtering method, or the like may be used.

Figure 4A:
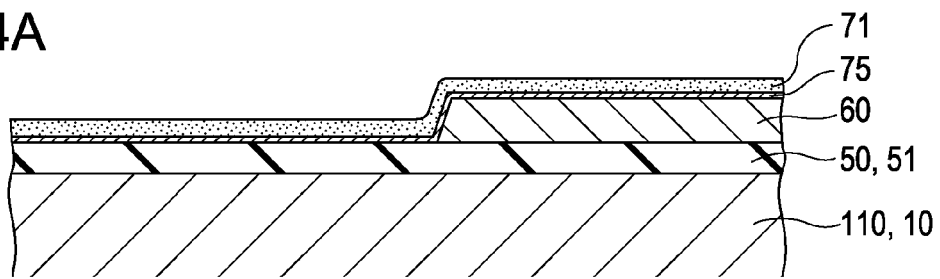
FIGS. 4A to 4C are schematic sectional views of a principal portion, showing steps for manufacturing of a recording head according to an embodiment of the present invention.

The specified method is described below. As shown in FIG. 4A, a piezoelectric precursor film 71 is formed on the seed layer 75. Namely, a sol (solution) containing an organo-metallic compound is applied to the passage-forming substrate 10 on which the seed layer 75 is formed (application step). Next, the piezoelectric precursor film 71 is heated to a predetermined temperature and dried for a predetermined time (drying step). For example, in this embodiment, the piezoelectric precursor film 71 can be dried by maintaining at 120° C. to 180° C. for 1 to 10 minutes.

Next, the dried piezoelectric precursor film 71 is degreased by heating to a predetermined temperature and maintaining for a predetermined time (degreasing step). For example, in this embodiment, the dried piezoelectric precursor film 71 is degreased by heating to a temperature of about 300° C. to 400° C. and maintaining for about 3 to 10 minutes. The term "degreasing" represents that the organic components contained in the piezoelectric precursor film 71 are released as $NO_2$, $CO_2$, $H_2O$, and the like.

Figure 4B:
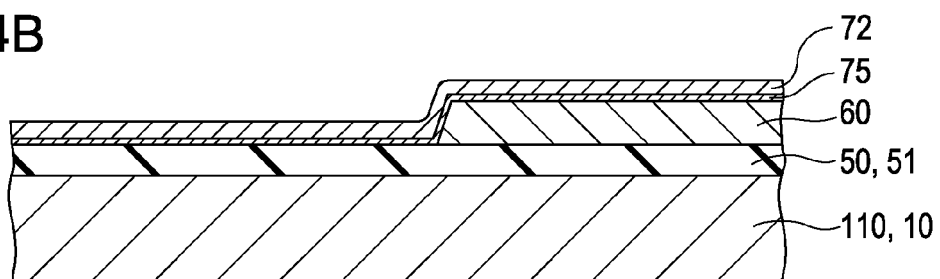

Next, as shown in FIG. 4B, the piezoelectric precursor film 71 is crystallized by heating to a predetermined temperature with an infrared heating device and maintaining for a predetermined time, thereby forming a piezoelectric film 72 (burning step).

Figure 4C:
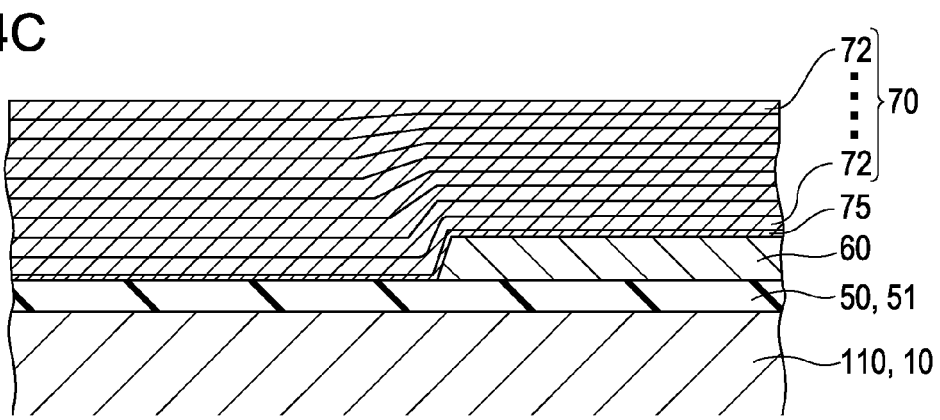

In addition, the infrared heating device used in the burning step can be used in the above-described drying step and degreasing step so that the number of the apparatuses used can be decreased to decrease the manufacturing cost. However, an apparatus different from the infrared heating device, for example, a hot plate or the like, may be used in the drying step and the degreasing step. As shown in FIG. 4C, the piezoelectric film forming steps including the application step, the drying step, the degreasing step, and the burning step are repeated several times to form the piezoelectric layer 70 including a plurality of piezoelectric films 72.

Figure 5A:
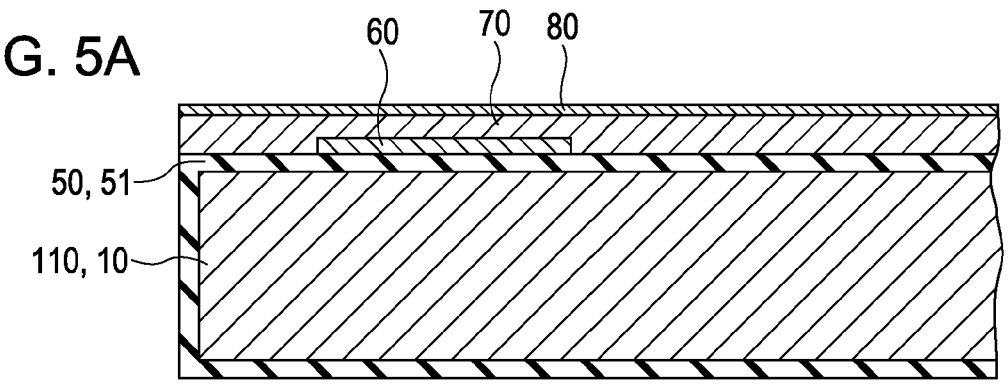
FIGS. 5A to 5C are schematic sectional views of a principal portion, showing steps for manufacturing of a recording head according to an embodiment of the present invention.
Figure 5B:
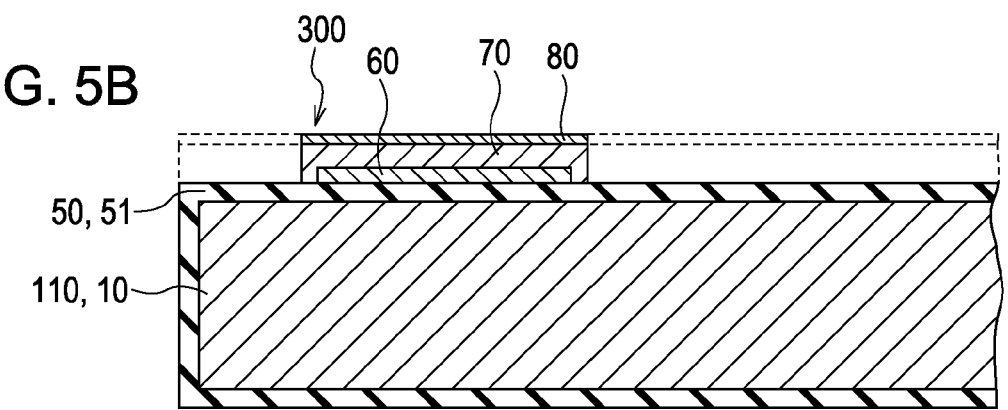

Next, as shown in FIG. 5A, the second electrode 80 is formed over the piezoelectric layer 70. Then, as shown in FIG. 5B, the piezoelectric layer 70 and the second electrode 80 are patterned to a region facing each of the pressure-generating chambers 12, forming the piezoelectric element 300. The piezoelectric layer 70 and the second electrode 80 are patterned by, for example, dry etching such as reactive ion etching, ion milling, or the like.

Figure 5C:
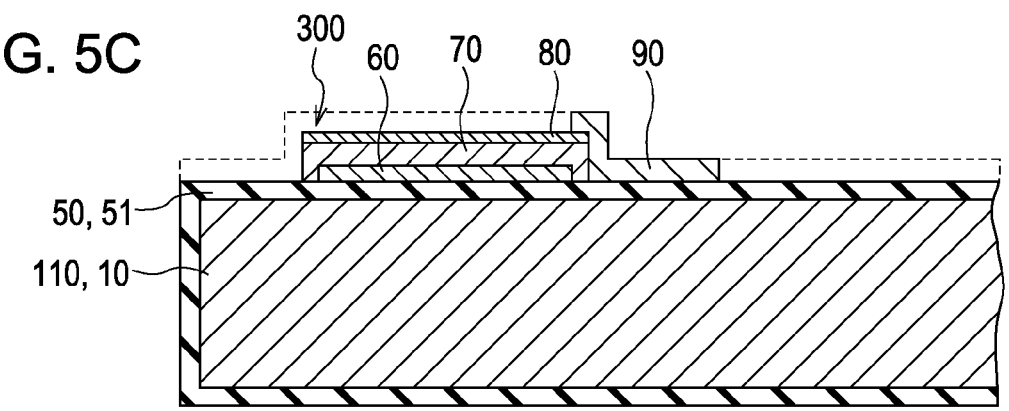

Next, the lead electrode 90 is formed. Specifically, as shown in FIG. 5C, the lead electrode 90 composed of, for example, gold (Au) or the like, is formed over the entire surface of the passage-forming substrate wafer 110 and then patterned for each piezoelectric element 300 through a mask pattern (not shown) composed of, for example, resist or the like.

Figure 6A:
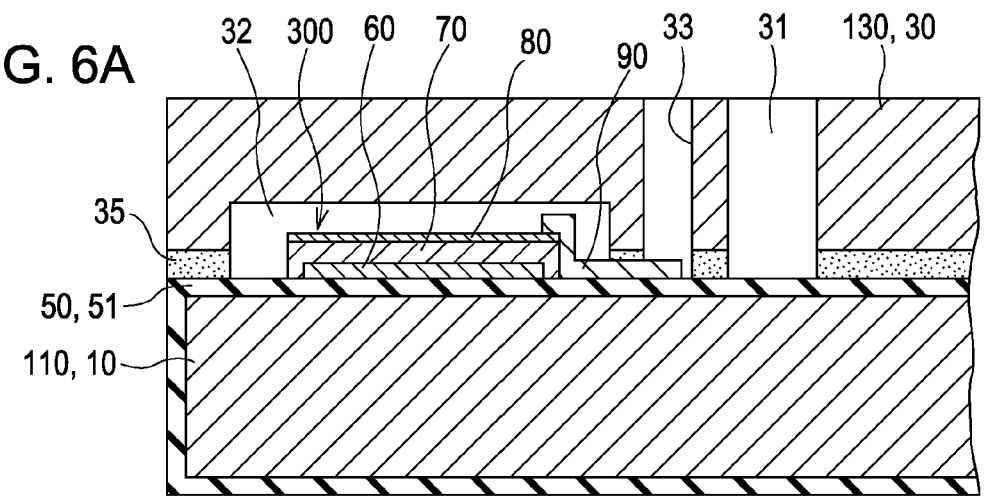
FIGS. 6A to 6C are schematic sectional views of a principal portion, showing steps for manufacturing of a recording head according to an embodiment of the present invention.

Then, as shown in FIG. 6A, a protective substrate wafer 130 which is a silicon wafer for a plurality of protective substrates 30 is bonded, with an adhesive 35, to the piezoelectric element 300 side of the passage-forming substrate wafer 110.

Figure 6B:
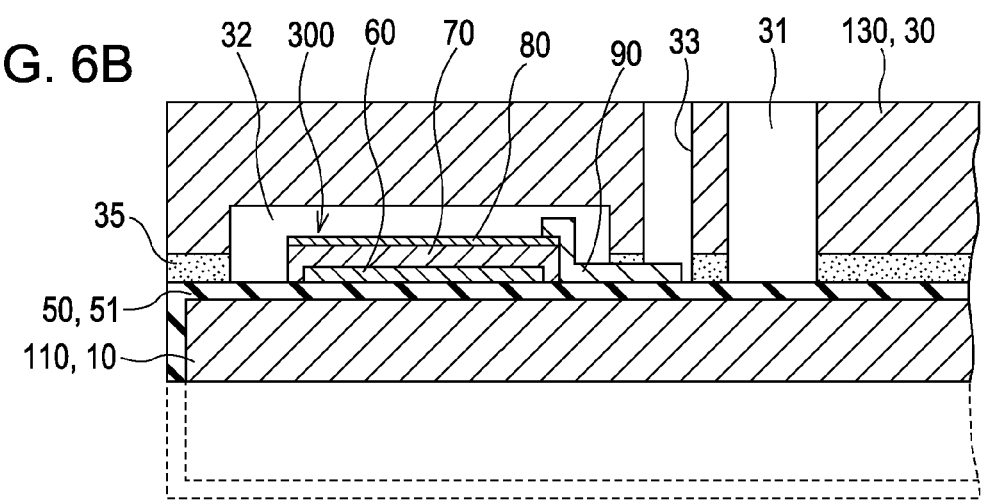

Next, as shown in FIG. 6B, the passage-forming substrate wafer 110 is thinned to a predetermined thickness.

Figure 6C:
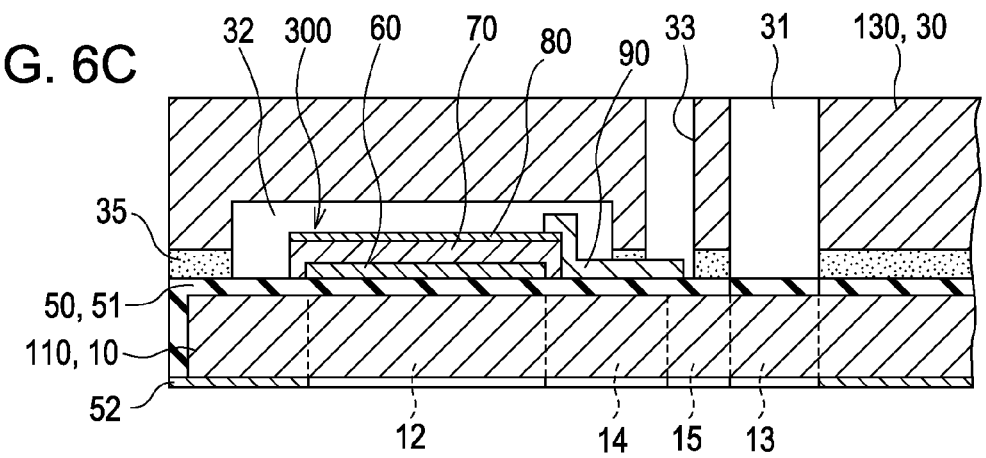
Figure 7:
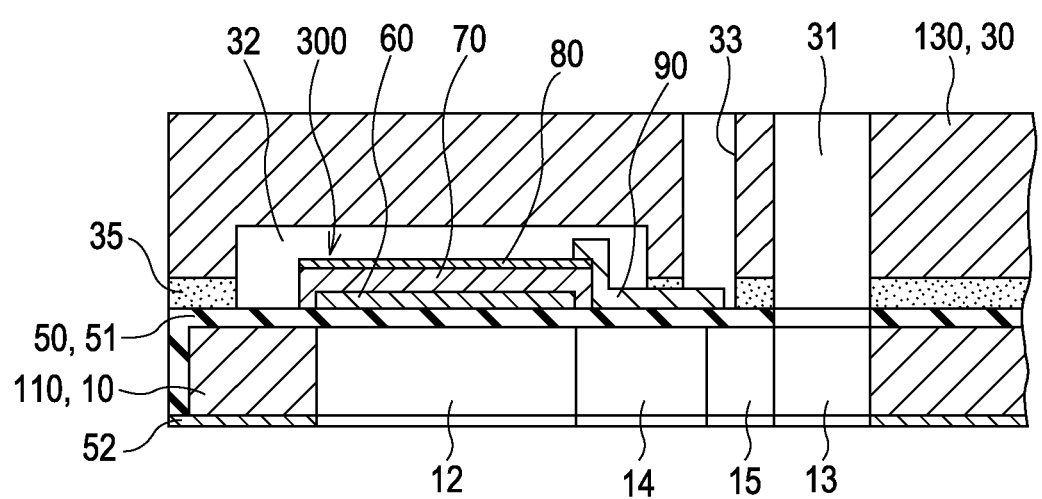
FIG. 7 is a schematic sectional view of a principal portion, showing a step for manufacturing of a recording head according to an embodiment of the present invention.

Then, as shown in FIG. 6C, a mask film 52 is newly formed on the passage-forming substrate wafer 110 and patterned in a predetermined shape. Then, as shown in FIG. 7, the passage-forming substrate wafer 110 is subjected to anisotropic etching (wet etching) with an alkali solution such as KOH or the like through the mask film 52 to form the pressure-generating chamber 12 corresponding to each of the piezoelectric elements 300, the communication portion 13, the ink supply passages 14, and the communication passages 15, etc.

Then, unnecessary peripheral portions of the passage-forming substrate wafer 110 and the protective substrate wafer 130 are removed by, for example, cutting by dicing or the like. Then, the nozzle plate 20 having the nozzle orifices 21 formed therein is bonded to the side of the passage-forming substrate wafer 110 opposite to the protective substrate wafer 130, and the compliance substrate 40 is bonded to the protective substrate wafer 130. Then, the passage-forming substrate wafer 110 is divided into chip-size passage-forming substrates 10 as shown in FIG. 1, thereby forming the ink jet recording head 1 according to this embodiment shown in FIG. 1.

In the above-described embodiment, the piezoelectric element 300 including the first electrode 60, the piezoelectric layer 70, and the second electrode 80 which are laminated in order on the substrate (passage-forming substrate) 10 is described as an example. However, the present invention is not limited to this and can be applied to, for example, a longitudinal vibration-type piezoelectric element which is expanded and contracted in an axial direction by alternately laminating a piezoelectric material and an electrode forming material.

(Ink Jet Recording Apparatus)

Figure 8:
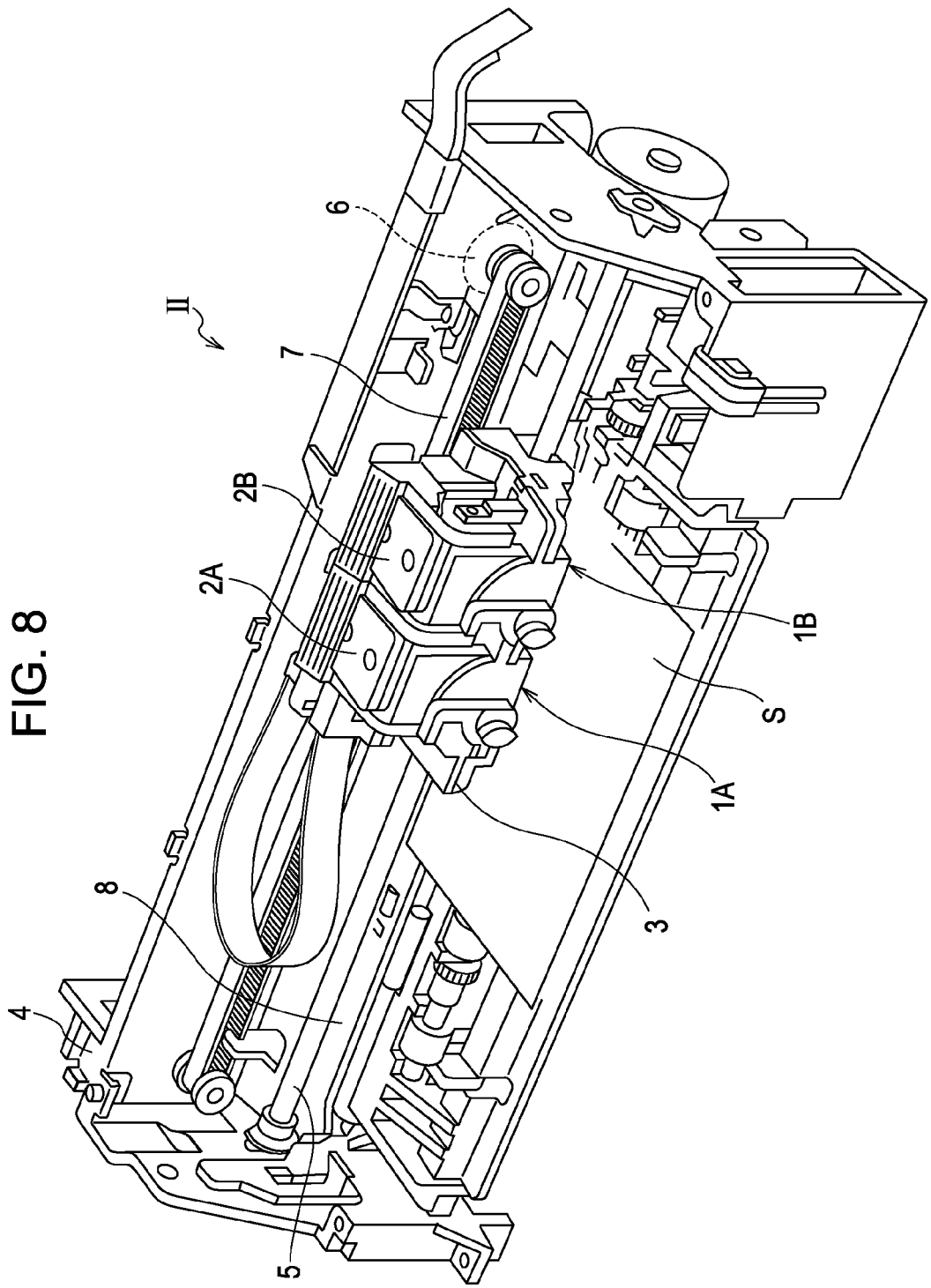
FIG. 8 is a perspective view of a liquid ejecting apparatus according to an embodiment of the present invention.

In an ink jet recording apparatus 11 shown in FIG. 8, recording head units 1A and 1B each having an ink jet recording head 1 are detachably provided with cartridges 2A and 2B, respectively, which constitute the ink supply unit. A carriage 3 provided with the recording head units 1A and 1B is provided on a carriage shaft 5 attached to an apparatus body 4 so that the carriage 3 can be moved in the axial direction. The recording head units 1A and 1B are adapted for, for example, ejecting a black ink composition and a color ink composition, respectively.

When the driving force of a driving motor 6 is transmitted to the carriage 3 through a plurality of gears (not shown) and a timing belt 7, the carriage 3 provided with the recording head units 1A and 1B is moved along the carriage shaft 5. On the other hand, a platen 8 is provided along the carriage shaft 5 of the apparatus body 4 so that a recording sheet S serving as a recording medium, such as paper or the like, which is supplied by a feed roller or the like (not shown), is transported by winding on the platen 8.

Although, in the first embodiment, the ink jet recording head is described as an example of the liquid ejecting head, the present invention is widely aimed at liquid ejecting heads in general and, of course, can be applied to a liquid ejecting head which ejects a liquid other than ink. Examples of other liquid ejecting heads include various recording heads used for image recording apparatuses such as a printer and the like, colorant ejecting heads used for producing color filters of a liquid crystal display and the like, electrode material ejecting heads used for forming electrodes of an organic EL display, FED (field emission display), and the like, bio-organic ejecting heads used for producing bio-chips, and the like.

The invention claimed is:

1. A piezoelectric element comprising;
a first electrode,
a seed layer provided above the first electrode and containing $BiFeO_3$,
a piezoelectric layer provided above the seed layer and containing $BiFeO_3$, $NdMnO_3$ and $BiAlO_3$, and
a second electrode provided above the piezoelectric layer.

2. The piezoelectric element according to claim 1, wherein the seed layer is preferentially oriented with a (001) plane.

3. The piezoelectric element according to claim 1, wherein the piezoelectric layer is preferentially oriented with a (001) plane.

4. The piezoelectric element according to claim 1, wherein the first electrode is composed of $SrRuO_3$.

5. The piezoelectric element according to claim 1, further comprises an elastic film containing $SrTiO_3$, and the first electrode is provided above the elastic film.

6. A liquid ejecting head comprising the piezoelectric element according to claim 1.

7. A liquid ejecting apparatus comprising the liquid ejecting head according to claim 6.

* * * * *